(12) United States Patent
Modi et al.

(10) Patent No.: US 11,596,072 B2
(45) Date of Patent: Feb. 28, 2023

(54) ELECTRICAL DEVICES WITH ELECTRODES ON SOFTENING POLYMERS AND METHODS OF MANUFACTURING THEREOF

(71) Applicant: Board of Regents, The University of Texas System, Austin, TX (US)

(72) Inventors: Romil Modi, Austin, TX (US); Jonathan Reeder, Austin, TX (US); Gregory T. Ellson, Dallas, TX (US); Walter E. Voit, Austin, TX (US); Alexandra Joshi Imre, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 420 days.

(21) Appl. No.: 16/591,002

(22) Filed: Oct. 2, 2019

(65) Prior Publication Data
US 2020/0093007 A1 Mar. 19, 2020

Related U.S. Application Data

(62) Division of application No. 15/794,863, filed on Oct. 26, 2017, now Pat. No. 10,485,109.

(Continued)

(51) Int. Cl.
*H05K 1/09* (2006.01)
*H05K 1/11* (2006.01)
(Continued)

(52) U.S. Cl.
CPC ............ *H05K 3/4007* (2013.01); *H05K 1/09* (2013.01); *H05K 1/111* (2013.01); *H05K 3/0041* (2013.01);
(Continued)

(58) Field of Classification Search
CPC .... H05K 3/4007; H05K 3/1216; H05K 3/048; H05K 3/064; H05K 3/067; H05K 3/1225;
(Continued)

(56) References Cited

U.S. PATENT DOCUMENTS 6,973,342 B1 12/2005 Swanson
7,914,842 B1 3/2011 Greenberg et al.
(Continued)

FOREIGN PATENT DOCUMENTS

| CN | 105326495 A | 2/2016 |
|---|---|---|
| EP | 2783727 A1 | 10/2014 |
| JP | S59141222 A | 8/1984 |

OTHER PUBLICATIONS

Ware, et al.; "Thiol-ene/Acrylate Substrates for Softening Intracortical Electrodes"; Journal of Biomedical Materials Research Part B: Applied Biomaterials; vol. 102; Issue 1; Jan. 2014; 3 pages.

(Continued)

*Primary Examiner* — Roshn K Varghese

(57) ABSTRACT

Flexible electrical devices comprising electrode layers on softening polymers and methods of manufacturing such devices, including lift-off processes for forming electrodes on softening polymers, processes for forming devices with a patterned double softening polymer layer, and solder reflow processes for forming electrical contacts on softening polymers.

5 Claims, 12 Drawing Sheets

Related U.S. Application Data

(60) Provisional application No. 62/414,532, filed on Oct. 28, 2016.

(51) Int. Cl.

| | | |
|---|---|---|
| *H05K 3/40* | (2006.01) | |
| *H05K 3/12* | (2006.01) | |
| *H05K 3/00* | (2006.01) | |
| *H05K 3/04* | (2006.01) | |
| *H05K 3/06* | (2006.01) | |
| H05K 3/34 | (2006.01) | |
| H01L 21/033 | (2006.01) | |
| H05K 1/03 | (2006.01) | |

(52) U.S. Cl.
CPC ............ *H05K 3/048* (2013.01); *H05K 3/064* (2013.01); *H05K 3/067* (2013.01); *H05K 3/1216* (2013.01); *H05K 3/1225* (2013.01); *H01L 21/0331* (2013.01); *H05K 1/0393* (2013.01); *H05K 3/1283* (2013.01); *H05K 3/3463* (2013.01); *H05K 2203/043* (2013.01); *H05K 2203/087* (2013.01); *H05K 2203/166* (2013.01)

(58) Field of Classification Search
CPC ...... H05K 3/3463; H05K 3/1283; H05K 1/03; H05K 1/0393; H05K 1/09; H05K 1/11; H05K 2203/043; H05K 2203/087; H05K 2203/166; H05K 2201/0104; H05K 2201/0133; H01L 21/0331
See application file for complete search history.

(56) References Cited

U.S. PATENT DOCUMENTS

| | | | |
|---|---|---|---|
| 2002/0084315 A1 | 7/2002 | Mackay et al. | |
| 2007/0073130 A1* | 3/2007 | Finch ................... | A61N 1/0551 600/372 |
| 2008/0255439 A1 | 10/2008 | Tang et al. | |
| 2010/0152410 A1* | 6/2010 | East ........................ | A61L 27/54 528/299 |
| 2011/0270067 A1 | 1/2011 | Faraji et al. | |
| 2012/0040531 A1 | 2/2012 | Mao | |
| 2013/0319972 A1 | 12/2013 | Greensberg et al. | |
| 2014/0094674 A1 | 4/2014 | Nurmikko et al. | |
| 2014/0141571 A1 | 5/2014 | Hassain et al. | |
| 2014/0290834 A1 | 10/2014 | Egron et al. | |
| 2014/0323647 A1* | 10/2014 | Voit ....................... | B29C 45/00 524/548 |
| 2015/0018659 A1 | 1/2015 | Ware et al. | |
| 2016/0103534 A1 | 4/2016 | Zhang et al. | |
| 2017/0079144 A1 | 3/2017 | Coleman et al. | |
| 2017/0182744 A1 | 6/2017 | Bellman et al. | |
| 2017/0326362 A1 | 11/2017 | Plachta et al. | |

OTHER PUBLICATIONS

Simon, et al.; "A Comparison of Polymer Substrates for Photolithographic Processing of Flexible Bioelectronics"; Biomed Microdevices; vol. 15; Issue 6; Dec. 2013; 15 pages.

Ware, et al.; "Thiol-ene/Acrylate Substrates for Softening Intracortical Electrodes"; Society for Biomaterials; pp. 1-11.

"Young's Modulus"; Wikipedia; Oct. 2016; 11 pages.

Geddes, et al.; "Criteria for the Selection of Materials for Implanted Electrodes" ; Annals of Biomedical Engineering; vol. 31; pp. 879-890.

Lee, et al.; "Fabrication and Characterization of Implantable and Flexible Nerve Cuff Electrodes with Pt, Ir and IrOx Films Deposited by RF Sputtering"; Journal of Micromechanics and Microengineering; pp. 1-8.

Ware, et al.; "Fabrication of Responsive, Softening Neural Interfaces"; Advanced Functional Materials; 2012; pp. 3470-3479.

Reeder, et al.; "Mechanically Adaptive Organic Transistors for Implantable Electronics"; Advanced Materials; 2014; pp. 4967-4973.

Myllymaa, et al.; "Flexible Implantable Thin Film Neural Electrodes"; University of Kuopio; undated; pp. 165-190.

Ware, et al.; "Three-Dimensional Flexible Electronics Enabled by Shape Memory Polymer Substrates for Responsive Neural Interfaces"; Macromolecular Materials and Engineering; 2012; pp. 1193-1202.

Arreaga-Salas, et al.; "Integration of High-Charge-Injection-Capacity Electrodes onto Polymer Softening Neural Interfaces"; American Chemical Society Applied Materials & Interfaces; vol. 7; Nov. 17, 2015; pgs. 26614-26623. http://pubs.acs.org/doi/abs/10.1021/acsami.5b08139.

Marmillion, et al.; "High Temperature Lift-off Structure"; IBM Technical Disclosure Bulletin, vol. 26 No. 12; May 1984; 2 pgs.

* cited by examiner

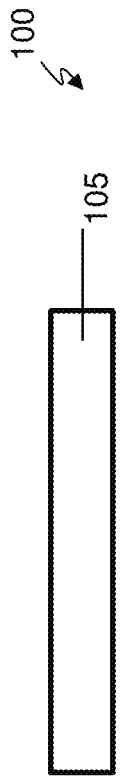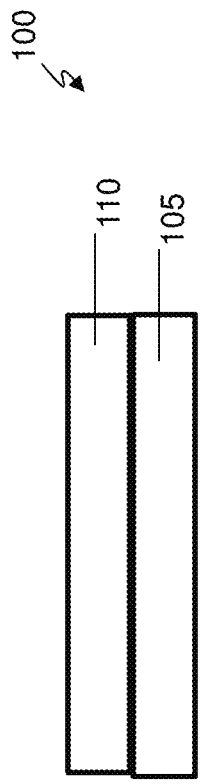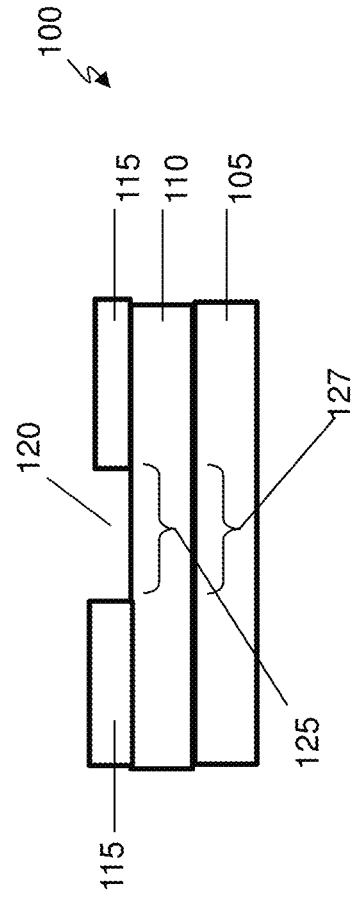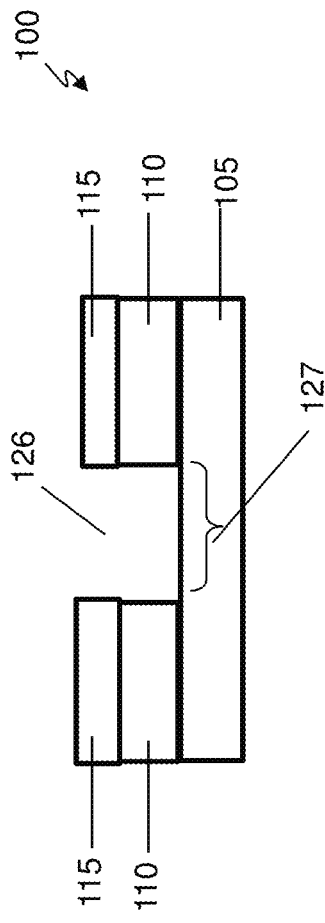

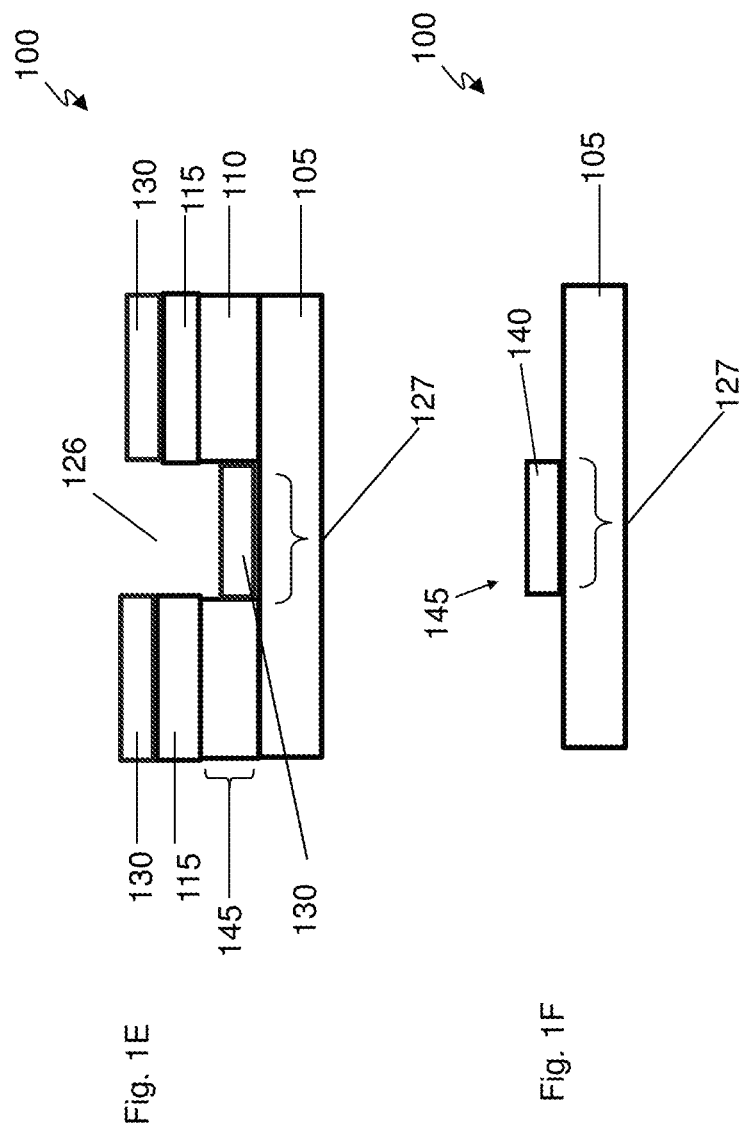

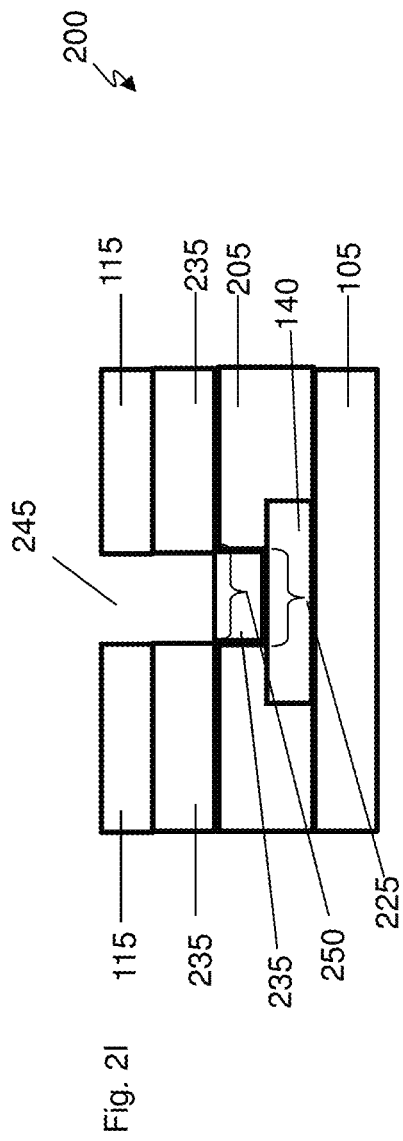

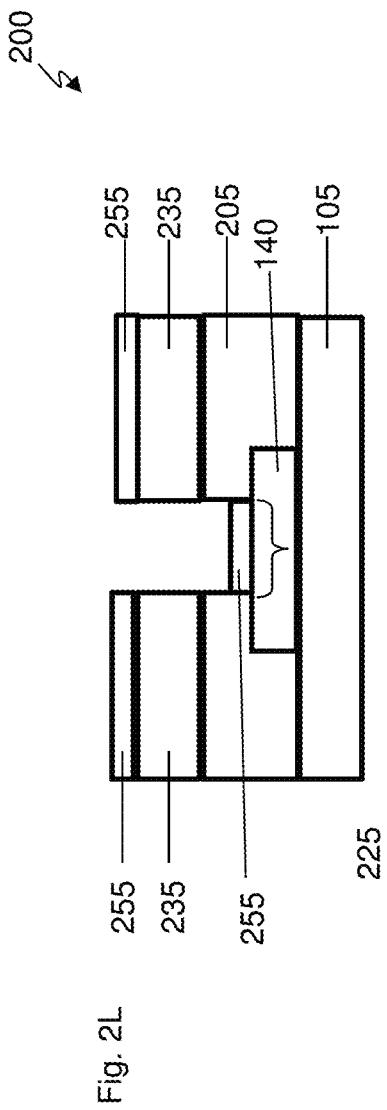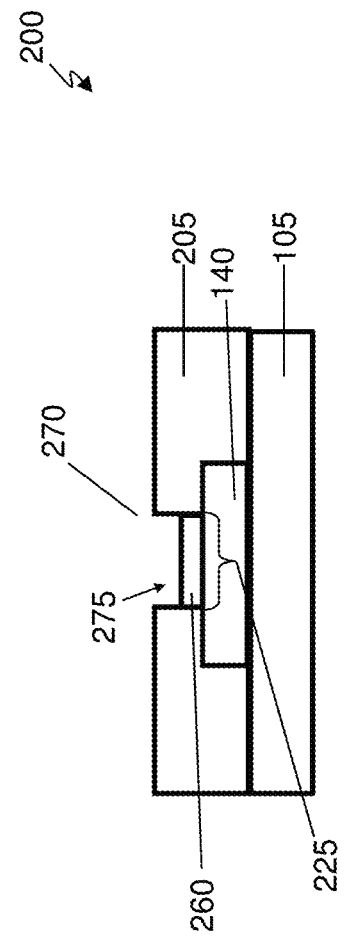

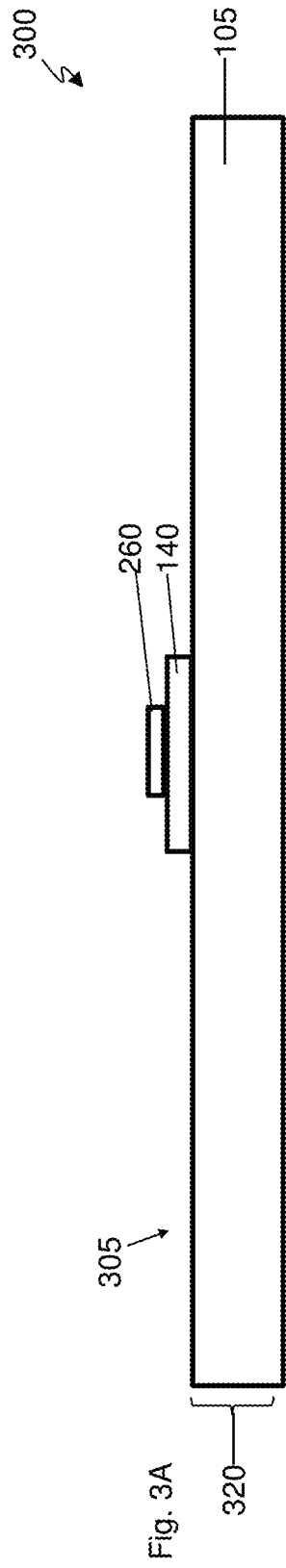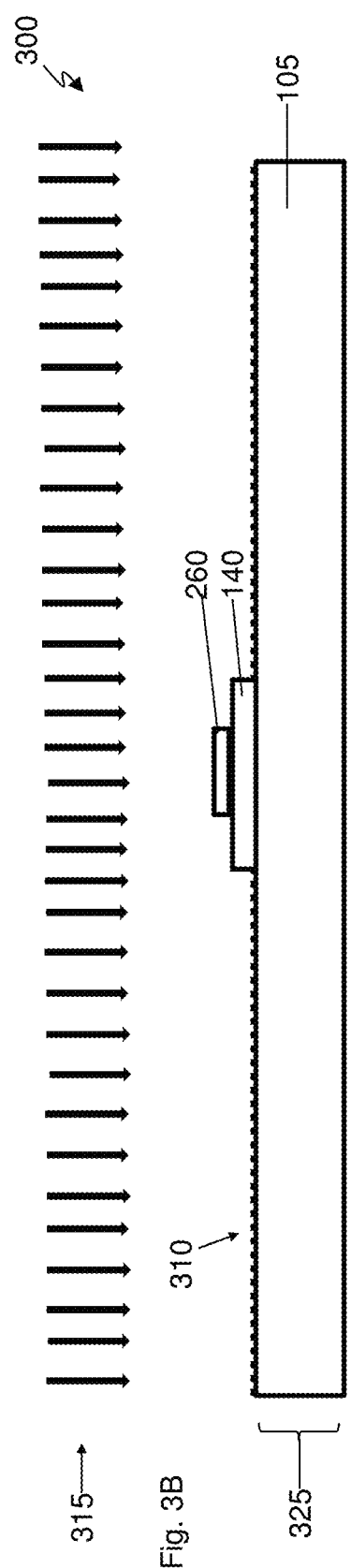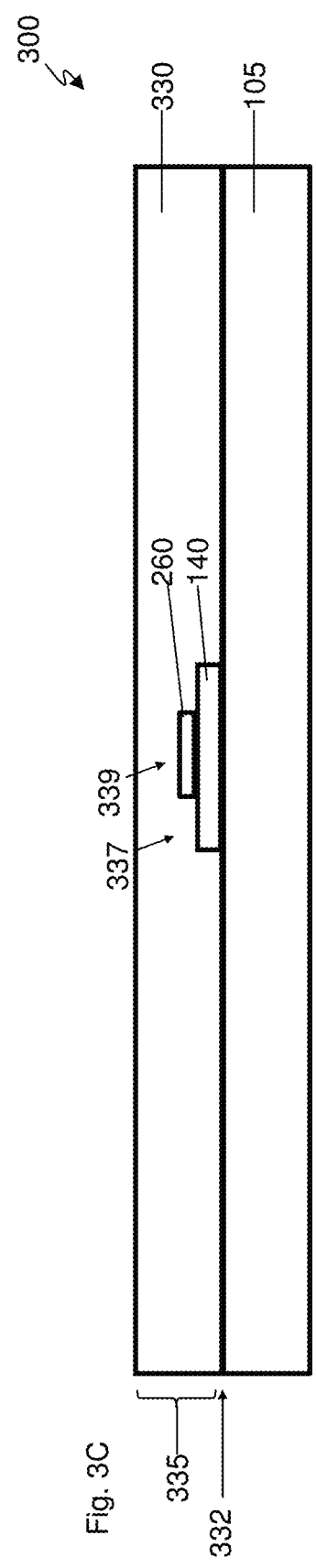

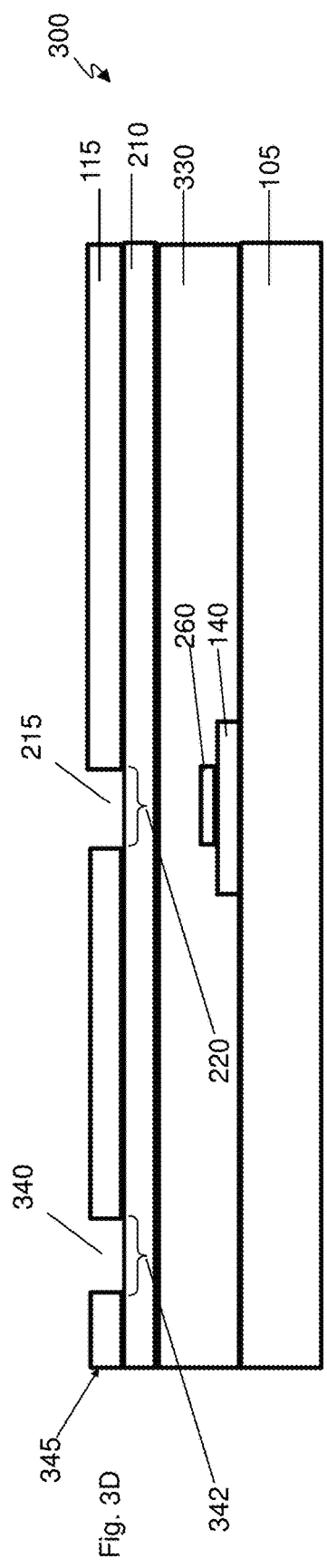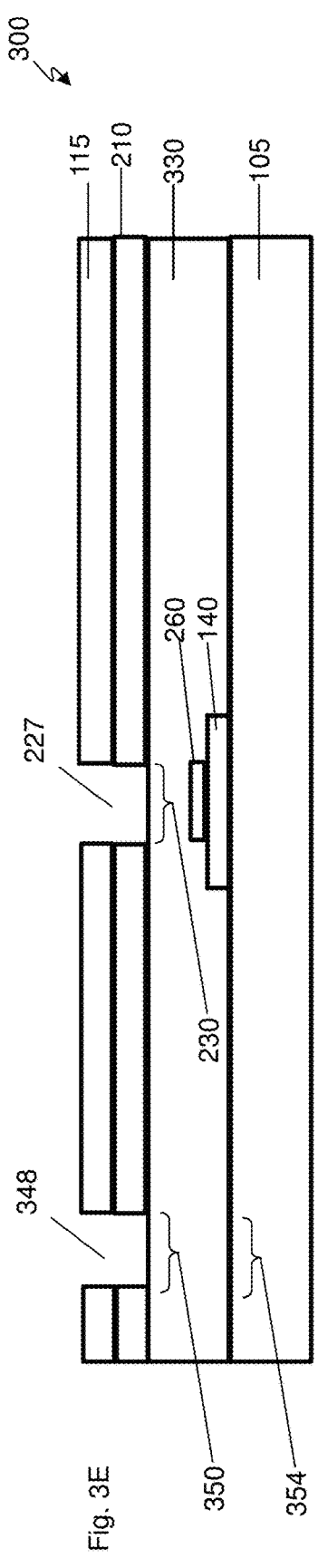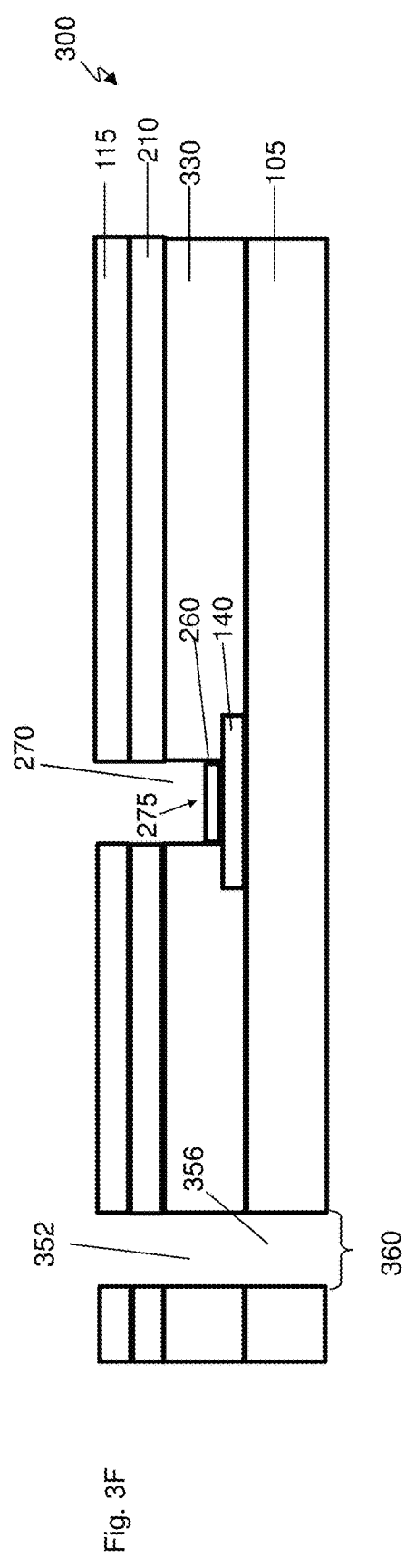

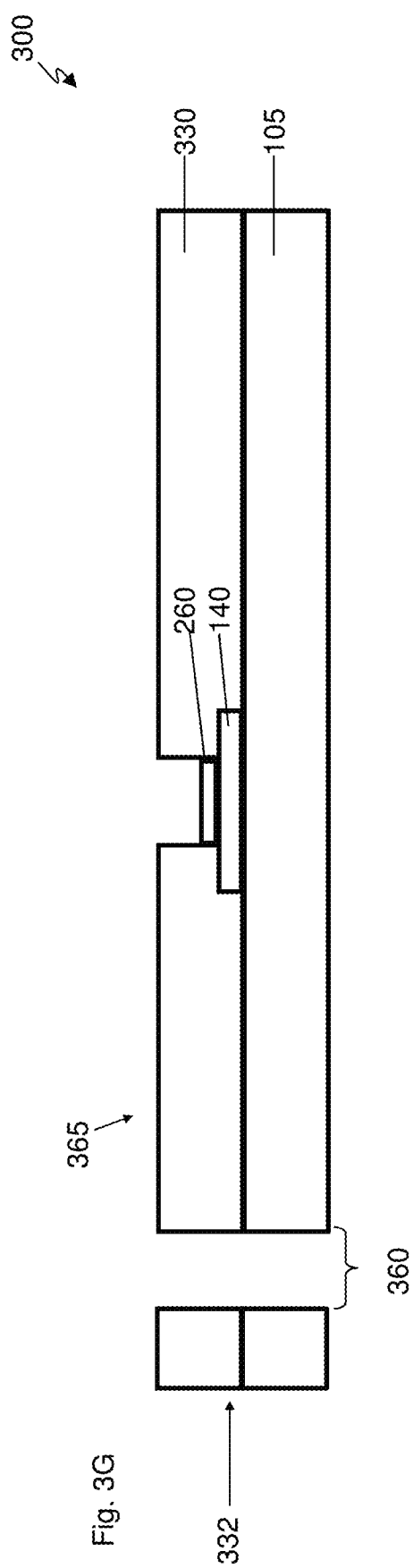

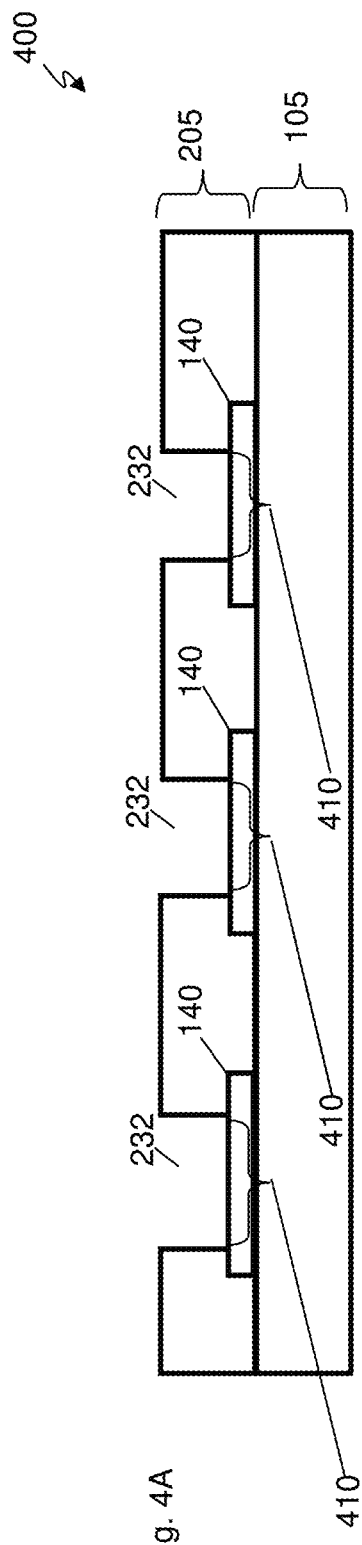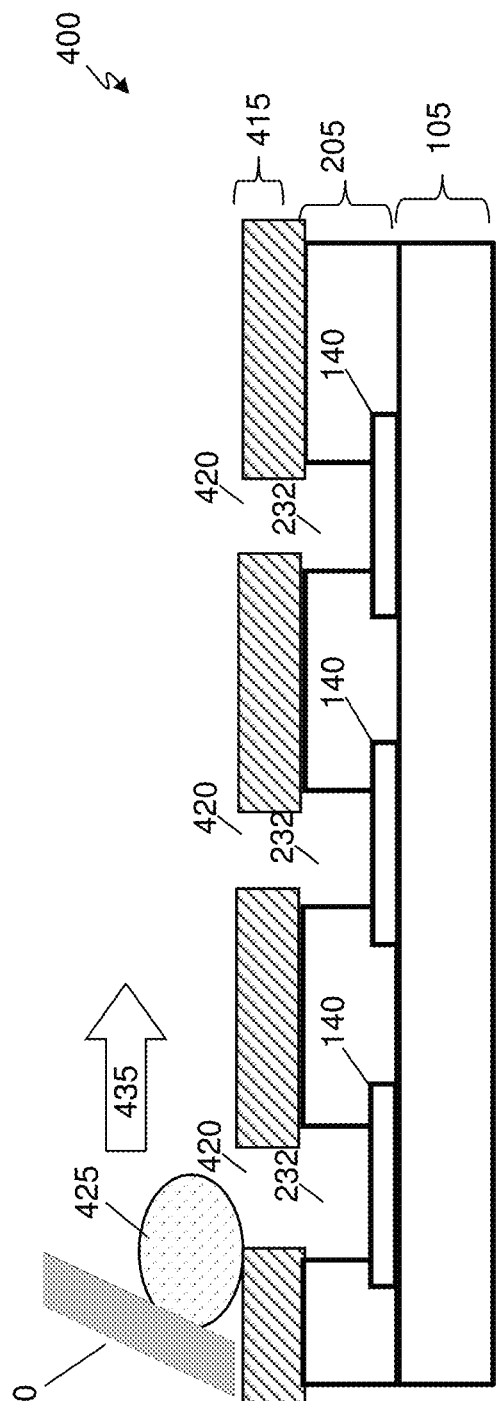

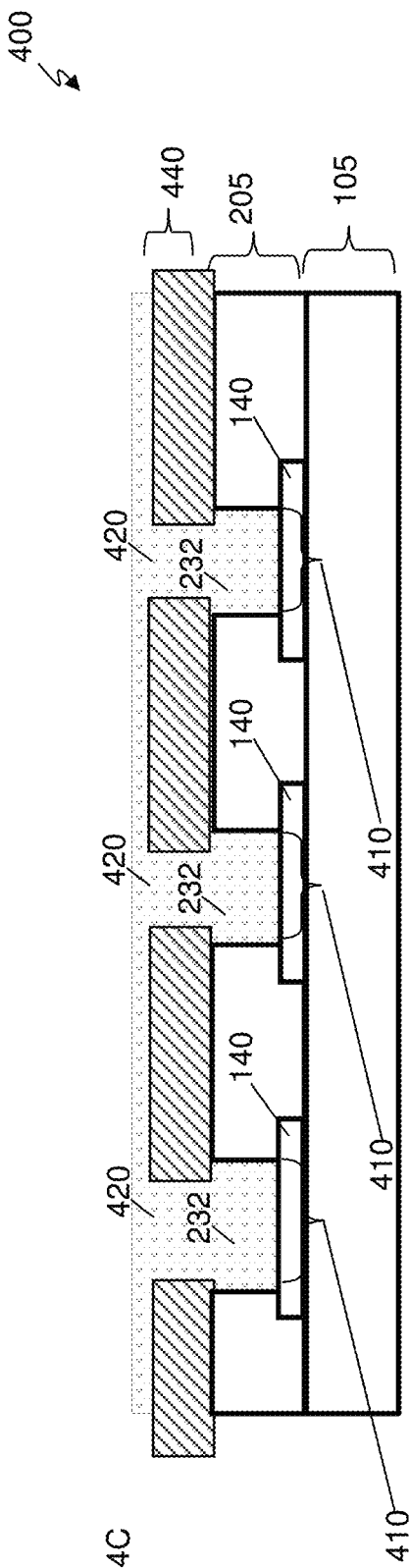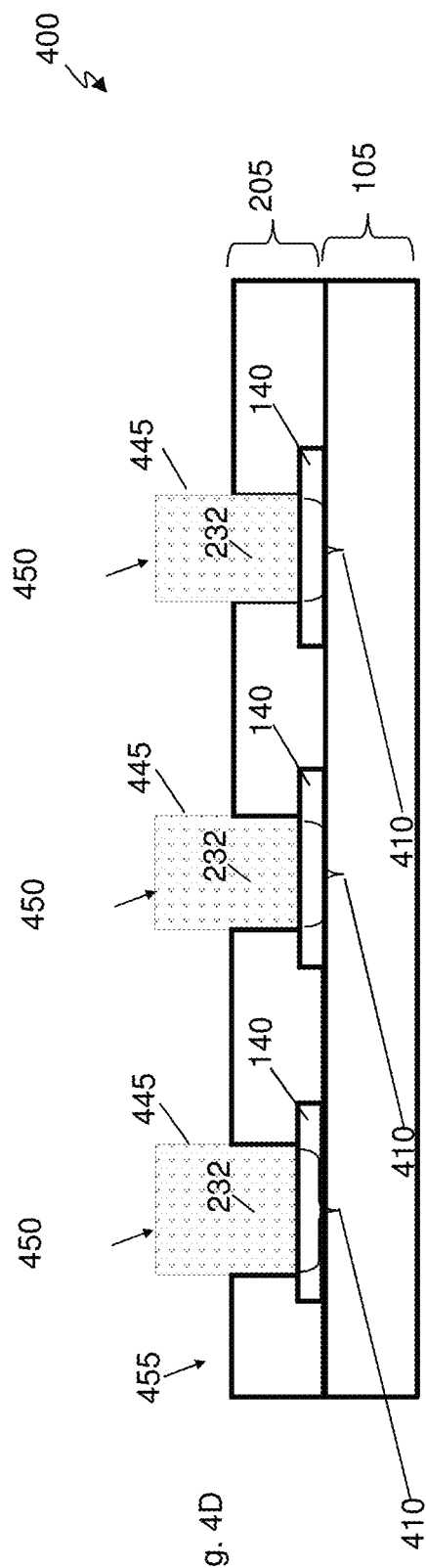

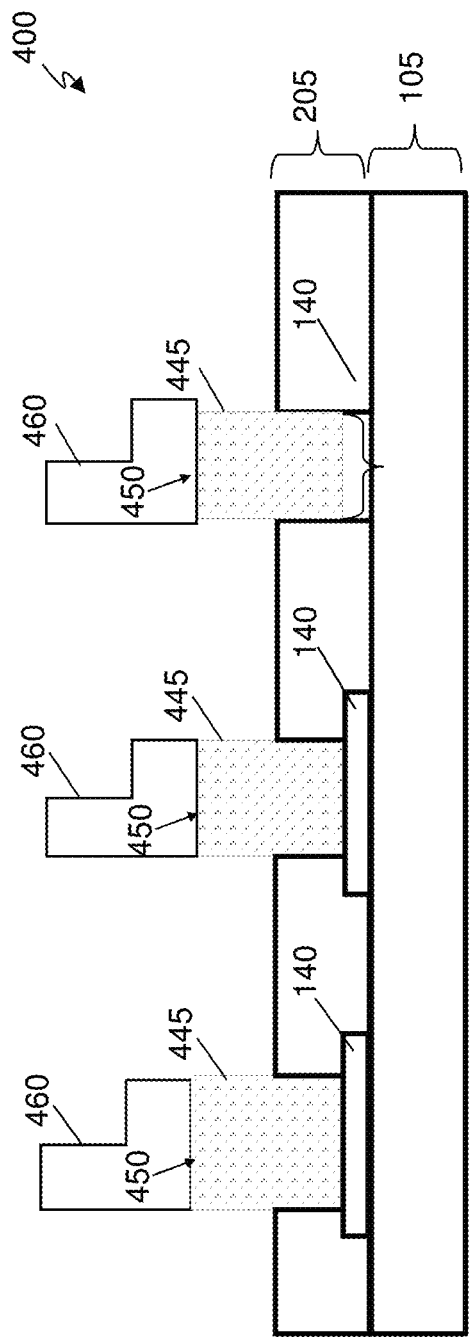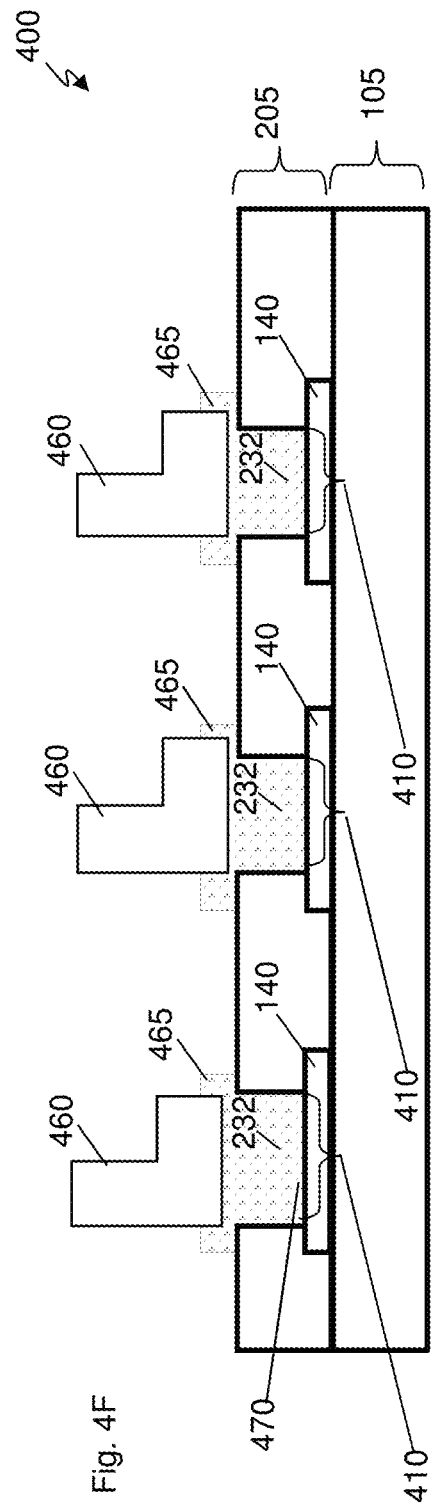

ELECTRICAL DEVICES WITH ELECTRODES ON SOFTENING POLYMERS AND METHODS OF MANUFACTURING THEREOF

CROSS-REFERENCE TO RELATED APPLICATION

This Application is a divisional of U.S. application Ser. No. 15/794,863 filed on Oct. 26, 2017, entitled ELECTRICAL DEVICES WITH ELECTRODES ON SOFTENING POLYMERS AND METHODS OF MANUFACTURING THEREOF, which claims the benefit of U.S. Provisional Application Ser. No. 62/414,532 filed on Oct. 28, 2016, commonly assigned with the present invention and incorporated herein by reference.

TECHNICAL FIELD

This application is directed, in general, to electrical devices, and more specifically, flexible electrical devices comprising electrode layers on softening polymers and methods of manufacturing such devices.

BACKGROUND

The ability to form electrical devices with components such as electrode traces and electrode pads, on softening polymers opens the opportunity to fabricate flexible electrical devices. Flexible electrical devices have many possible biomedical applications, e.g., as implantable or non-implanted devices. There is a continuing need to improve the processes to fabricate such devices, such that the devices are more sensitive, less prone to delamination of the electrical components from the polymers, and/or, connectable to recording or stimulating control devices.

SUMMARY

One embodiment is a method of manufacturing an electrical device. Embodiments of the method comprise forming a patterned inorganic liftoff layer to expose a target electrode site on a softening polymer layer, depositing an electrode layer on the inorganic liftoff layer and on the exposed target electrode site and removing the inorganic liftoff layer by a horizontal liftoff etch to leave the electrode layer on the exposed target electrode site.

In some embodiments, the inorganic liftoff layer can have a thin film stress of less than about 150 MPa. In some embodiments, forming the patterned inorganic liftoff layer can include removing portions of the inorganic liftoff layer exposed through openings in a patterned photoresist layer on the inorganic liftoff layer by a fluorine plasma dry etch process. In some embodiments, removing the inorganic liftoff layer by the horizontal liftoff etch can include etchant solvent exposure of the: inorganic liftoff layer, a photoresist layer on the inorganic liftoff layer and portions of the electrode layer on the photoresist layer. The etchant solvent exposure can be for at least about 20 hours at about 25° C. and the etchant solvent can include an ester-based photoresist removing solvent or a potassium borate photo developing solution.

Another embodiment is an electrical device comprising a softening polymer layer and an electrode layer on the softening polymer layer. At least a portion of the electrode layer has less than about 100 ppm Carbon/micron$^2$ of organic material thereon.

In some embodiments, the portion of the electrode layer can have a root mean squared surface roughness of about 5 nm or greater. In some embodiments, the portion of the electrode layer has a surface area that is at least about 10 percent greater than a surface area of a same sized planar two-dimensional perimeter.

Another embodiment is another method of manufacturing an electrical device. The method comprises forming a softening polymer layer with an electrode layer on a surface of the softening polymer layer and forming a second softening polymer layer on the surface of the softening polymer layer. A mechanical neutral plane of the electrical device is located substantially at or above the surface of the softening polymer layer. An opening in the second softening polymer cover layer exposes a portion of a surface of the electrode layer.

Some embodiments can further include forming an inorganic hardmask layer on the second softening polymer cover layer. Some embodiments can further include removing, by a reactive ion etch process, a portion of the inorganic hardmask layer exposed through an opening in a patterned photoresist layer located on the inorganic hardmask layer to form an opening in the inorganic hardmask layer. Some embodiments can further include removing, by the reactive ion etch process, exposed portions of the cover layer underlying the opening in the inorganic hardmask layer to form the opening in the second softening polymer cover layer. Some embodiments can further include removing the patterned photoresist layer and the inorganic hardmask layer. Some embodiments can further include depositing a second electrode layer on the inorganic liftoff layer and the portion of the surface of the electrode layer. Some embodiments further include removing the inorganic hardmask layer by a horizontal liftoff etch that includes exposing the inorganic hardmask layer to an ester-based photoresist removing solvent or a potassium borate photo developing solution.

Some embodiments further include exposing the surface of the softening polymer layer to a reactive ion etch treatment before forming the second softening polymer layer on the surface of the softening polymer layer. In some such embodiments, the surface of the softening polymer layer after the reactive ion etch treatment can have an at least double a root mean squared surface roughness as compared to the surface before the reactive ion etch treatment. In some such embodiments, a thickness of the softening polymer layer after the reactive ion etch treatment can be within about ±5 percent of the thickness of the softening polymer layer before the reactive ion etch treatment.

In some embodiments, the removing, by the reactive ion etch process, of the exposed portions of the cover layer can include forming a plasma formed from a feed gas of oxygen at about 200 W biasing power and a pressure of about 200 mTorr.

Another embodiment is another electrical device. The electrical device comprises a softening polymer layer, an electrode layer on a surface of the softening polymer layer and a cover layer composed of a second softening polymer on the surface of the softening polymer layer. A mechanical neutral plane of the device is located substantially at or above the surface of the softening polymer layer. An opening in the second softening polymer cover layer exposes a portion of a surface of the electrode layer.

In some embodiments, the cover layer has a Young's modulus that can be within about ±10 percent of a Young's modulus of the softening polymer layer. In some embodiments the cover layer has a thickness can be within about ±10 percent of a thickness of the softening polymer layer.

Another embodiment can be another method of manufacturing an electrical device. The method comprises placing a stencil mask on a polymer cover layer of the electrical device. Apertures in the stencil mask can each align with one of a plurality of openings in the polymer cover layer, each of the openings exposing contact pad site portions of electrode layers on a softening polymer layer of the electrical device. The method comprises stencil printing to provide a layer of solder paste that fills the apertures and the openings and contacts the exposed contact pad site portions of the electrode layers. The method comprises removing the stencil mask to form discrete solder contacts located on the exposed contact pad site portions of the electrode layers. The method comprises aligning electrical connector electrodes with each of the solder contacts such that each one of connector electrodes lay on the top surface of one of the solder contacts. The method comprises reflowing the solder contacts to couple the connector electrodes to the contact pad site portions of the electrode layers.

In some embodiments, the reflowing of the solder contacts includes a reflow cycle that can include a pre-heat phase followed by a soaking phase followed by a reflow phase followed by a cooling phase. The pre-heat phase can include heating the electrical connector electrodes to a temperature of about 90° C. The soaking phase can include increasing the temperature of the solder contacts to about 150° C. The reflow phase can include increasing the temperature of the solder contacts and the electrical connector electrodes to a temperature of about 190° C. to form a solder joint. The cooling phase can include decreasing the temperature of the solder joint at a rate of about 1.83° C./s.

Another embodiment is another electrical device. The electrical device comprises a softening polymer layer, an electrode layer on a surface of the softening polymer layer and a cover polymer layer on the surface of the softening polymer layer. An opening in the polymer cover layer is filled with a reflowed solder. One end of the reflowed solder, located inside the opening, contacts a contact pad site portion of the electrode layer. Another end of the reflowed solder contacts an electrical connector electrode of the device.

In some embodiments, the solder is composed of an indium silver solder.

BRIEF DESCRIPTION

The embodiments of the disclosure are best understood from the following detailed description, when read with the accompanying FIGUREs. Some features in the figures may be described as, for example, "top," "bottom," "vertical" or "lateral" for convenience in referring to those features. Such descriptions do not limit the orientation of such features with respect to the natural horizon or gravity. Various features may not be drawn to scale and may be arbitrarily increased or reduced in size for clarity of discussion. Reference is now made to the following descriptions taken in conjunction with the accompanying drawings, in which:

FIGS. 1A-1F show an example coverless flexible electrical device of the disclosure at intermediate stages of a manufacturing process which includes an example lift-off process embodiment of the disclosure;

FIGS. 2A-2J and 2L-2M show an example covered flexible electrical device of the disclosure at intermediate stages of an example manufacturing process of the disclosure which includes another example lift-off process embodiment of the disclosure;

Figure 2A:

FIGS. 3A-3G show an example flexible electrical device of the disclosure at intermediate stages of an example manufacturing process of the disclosure with double softening polymer layer-containing embodiments of the disclosure; and FIGS. 4A-4F show an example flexible electrical device of the disclosure at intermediate stages of an example manufacturing process of the disclosure using a solder reflow process embodiment of the disclosure.

DETAILED DESCRIPTION

The different fabrication processes disclosed herein are each designed to improve the utility of the resulting flexible electrical devices. In some embodiments, these processes can be performed independently of each other in separate process flows to provide different types of improvements in the respective resulting devices. In other embodiments, any combination of these processes may be performed in a same process flow to provide a combination of improvements in the resulting device.

While the disclosed embodiments refer to electrode layers such as electrode traces and electrode pads, any of these embodiments could further include transistors, diodes, switches, circuits, or other electrical components, located on the softening polymer layer and, e.g., connected to some such electrode layers.

Lift-Off Process for Forming Electrodes on Softening Polymers

Embodiments of present disclosure benefit from the recognition that for some embodiments of flexible electrical devices, certain conventional lithographic and patterning processes for forming one or more electrode layers on a softening polymer includes forming an opening in a polymer cover layer to uncover the electrode layer.

The electrode layer may be a thin electrode trace, e.g., configured to conduct electrical signals to and from an external recording or stimulating device, and/or, an electrode interaction pad, e.g., a portion of the electrode layer configured to send blocking or stimulation signals and/or to record electrical signals.

We have found that conventional lithographic and patterning processes can leave residual organic material (e.g., residual photoresist material or residual polymer cover layer material) on the surface of the electrode layer. The presence of such residual organic material, in turn, can reduce the sensitivity of the electrode layer. For instance, not as much electrical charge may be generated at the electrode interaction pad as compared to a same-area pristine pad with no organic material thereon. For instance, the electrode interaction pad may not detect electrical signals generated in nerves as sensitively as compared to a pristine pad with no organic material thereon.

Although aggressive clean-up procedures (e.g., reactive ion etching) may remove some of the residual organic material from the interaction pads, for certain types of electrode materials having rough surfaces, such clean-up procedures may require extended periods, thereby lengthening device fabrication times and complexity, and/or, the clean-up procedures may not remove all of the residual organic material. Moreover, such aggressive clean-up procedures may decrease the surface roughness of the electrode interaction pad which, in turn, may detrimentally decrease the charge injection capacity of the interaction pad. Some aggressive clean-up procedures using oxygen plasmas may oxidize the electrode interaction pad, which in turn, may cause an undesirable decrease of charge injection capacity.

To address these issues, we have developed a liftoff process that allows for the patterning of electrodes on a softening polymer layer. Unlike liftoff processes that use organic photoresist to pattern electrodes on a softening polymer layer, we use an organic photoresist to pattern openings in an inorganic liftoff layer on a softening polymer layer.

We discovered that using an organic photoresist directly as a lift-off material was problematic because the solvents used to lift off the photoresist also can degrade the softening polymer layer and/or delaminate the softening polymer layer from other layers of the device (e.g., a polymer cover layer). In contrast, the etchants used to lift off the inorganic liftoff layer, as disclosed herein, do not substantially degrade or delaminate the softening polymer layer.

One embodiment is a method of manufacturing a flexible electrical device. FIGS. 1A-1F show an example flexible electrical device 100 of the disclosure at intermediate stages of a manufacturing process which includes an embodiment of the lift-off process of the disclosure.

FIG. 1A shows the device 100 after forming a softening polymer layer 105.

In some embodiments, the softening polymer layer 105 can be formed by polymerizing monomers of the polymer on a sacrificial substrate (e.g. a glass substrate) and then the softening polymer layer 105 can be peeled away from the substrate.

The term softening polymer as used herein refers to a polymer that softens by more than 1 order of magnitude (i.e., Young's modulus decrease by 1 order of magnitude) within an about 30° C. temperature increase (from room temperature, about 20° C., to about 50° C. or less or in some embodiments to about 37° C.).

Non-limiting example softening polymers that the layer 105 can be composed of include hydrogels or shape memory polymers.

As understood by those skilled in the pertinent arts, shape memory polymers are self-adjusting, smart polymer materials whose shape change can be controlled at specific, tailored temperature. Examples of shape memory polymers include polymers formed from a combination of the monomers: 1,3,5-triallyl-1,3,5-triazine-2,4,6 (1H,3H,5H)-trione (TATATO), tris[2-(3-mercaptopropionyloxy)ethyl] isocyanurate (TMICN), trimethylolpropane tris(3-mercaptopropionate) (TMTMP) and tricyclo[5.2.1.0$_{2,6}$]decanedimethanol diacrylate (TCMDA). Other example shape memory polymers include polymers formed from a combination of thiol- and ene-functionalized monomers.

Other examples of shape memory polymers include polymers formed from a combination of thiol-, ene- and acrylate-functionalized monomer. Non-limiting examples of thiol-ene softening polymer compositions are TATATO/TMICN (0.5/0.5), and TATATO/TMTMP (0.5/0.5). Examples of thiol-ene-acrylate softening polymer compositions are TATATO/TMICN/TCMDA (0.345/0.345/0.31), and TATATO/TMTMP/TCMDA (0.345/0.345/0.31), such as disclosed in Ware et al. (J Biomed Mater Res Part B 2014: 102B, 1-11) which is incorporated by reference in its entirety.

Other examples of shape memory polymers include polymers formed from a combination of thiol and isocyanate functionalized monomers. Non-limiting examples include the polymer formed via the base or thermally catalyzed polymerization reaction of thiol and isocyanate monomers or oligomers. The monomers or oligomers may have at least one functional group of thiol or isocyanate present on the molecule, such as but not limited to 2,2'-(ethylenedioxy) diethanethiol, isophorone diisocyanate, hexamethylene diisocyanate, or tris(6-isocyanatohexyl)isocyanurate.

Other example shape memory polymers include polymers formed from a combination of thiol- and epoxy-functionalized monomers. Non-limiting examples include the polymers formed from combinations of the thiol- and epoxy-functionalized monomers disclosed by Simon et al. (Biomed Microdevices (2013) 15: 925. doi:10.1007/s10544-013-9782-8) which is incorporated by reference in its entirety.

FIG. 1B shows the device 100 after forming an inorganic liftoff layer 110 on the softening polymer layer 105.

Some embodiments of inorganic liftoff layer 110 are low stress layers, e.g., layers having a thin film stress of less than about 150 MPa, or less than about 100 MPa, or less than about 50 MPa, or less than about 20 MPa for various different embodiments of the layer. While not limiting the scope of the disclosure by theoretical considerations, it is thought that for at least some embodiments, such low stress layers maintain device integrity e.g., by mitigating cracking or wrinkling after and/or during a device fabrication process step, when the softening polymer layer may transition to a softened state.

In some embodiments, forming the inorganic liftoff layer 110 includes depositing silicon nitride, silicon oxynitride or silicon oxide by a low stress plasma enhanced chemical vapor deposition process (PECVD). While not limiting the scope of the disclosure by theoretical considerations, it is thought that for at least some embodiments, the use of a PECVD silicon nitride process can advantageously produce a very low stress inorganic liftoff layer 110 (e.g., a thin film stress of less than about 50 MPa). While not limiting the scope of the disclosure by theoretical considerations, it is thought that for at least some embodiments, the use of a PECVD silicon oxide process can advantageous produce an inorganic liftoff layer 110 that may be faster to dissolve via a horizontal etch as further dissolved herein, e.g., as compared to dissolving an inorganic liftoff layer 110 formed via PECVD silicon oxynitride.

A non-limiting example of a low stress PECVD silicon oxynitride process to form the inorganic liftoff layer 110 includes using feed gases of $SiH_4$, $NH_4$, He, and $N_2$, at a pressure of about 900 milliTorr and deposition temperature of about 150° C. A non-limiting example of a low stress PECVD silicon oxide process to form the inorganic liftoff layer 110 includes feed gases of $SiH_4$, $NH_4$, He, and $N_2$, at a pressure of about 900 milliTorr and deposition temperature of about 250° C.

In some embodiments, forming the inorganic liftoff layer 110 includes sputter depositing or evaporating metals onto the softening polymer layer. Non-limiting example of suitable evaporated metals for use as materials of the inorganic liftoff layer 110 include gold, titanium, platinum, iridium, and some reactively sputtered materials, such as titanium nitride, Platinum, gold and iridium oxide. Non-limiting example of suitable sputter deposited metals for use as materials of the inorganic liftoff layer 110 include porous TiN thin film formed by RF magnetron sputtering using a base pressure of about $10^{-5}$ torr with Ar and $N_2$ gas flow of 180 sccm and 240 sccm, respectively to provide a deposition rate of 7.5 nm/min.

Non-limiting example sputter deposition parameters include about 20 milliTorr argon pressure and about 200 Watt biasing power. Non-limiting example evaporation parameters include about 0.005 milliTorr base pressure, and an about 0.2 nm per second evaporation rate.

FIG. 1C shows the device 100 after forming an organic photoresist layer 115 on the inorganic liftoff layer 110 and after patterning the organic photoresist layer 115 to form an opening 120 therein. The opening 120 exposes a portion 125 of the inorganic liftoff layer 110, the opening 120 lying directly over a target electrode trace site portion 127 of the softening polymer layer 105.

In some embodiments the photoresist can be a negative resist such as AZ-nLOF-2000 (Microchem Corporation). In other embodiments, negative photoresist materials or positive resist materials such as S-1813, S-1805, S-1820 (Rohm and Haas Company) may be used.

Patterning the organic photoresist layer 115 to form the opening 120 therein can be accomplished by conventional photolithographic patterning and etching procedures familiar to those skilled in the pertinent art.

FIG. 1D shows the device 100 after forming a patterned inorganic liftoff layer 110 by removing the portion 125 of the inorganic liftoff layer 110 exposed by the patterned photoresist layer 115 to form an opening 126 therein to thereby expose the target electrode trace site portion 127 of the softening polymer layer 105.

In some embodiments, removing the exposed portion 125 of the inorganic liftoff layer 110, which transfers the patterns formed in the photoresist layer 115 to the inorganic lift-off layer 110, can include a fluorine plasma dry etch process using $SF_6$ gas at about 100 milliTorr pressure.

FIG. 1E shows the device 100 after depositing an electrode material layer 130 on the inorganic liftoff layer 110 and on the exposed target electrode trace site portion 127 of the softening polymer layer 105.

In some embodiments, the electrode material layer 130 can be deposited by a sputtering, an evaporation or an electro-deposition process. Non-limiting example electron deposition parameters include no sample rotation with accelerating voltage of about 10 KV. Non-limiting example evaporation parameters include 0.001 milliTorr base pressure, and 0.5-5 Angstroms per second evaporation rate. Non-limiting example sputtering parameters include RF magnetron sputtering with base pressure of about $10^{-5}$ torr with Ar and $N_2$ gas flow of about 180 sccm and about 240 sccm, respectively to provide a deposition rate of about 7.5 nm/min.

While not limiting the scope of the disclosure by theoretical considerations, for some embodiments, it is thought that sputter depositing may be preferred because the electrode material layer 130 formed has a smaller grain size e.g., because the layer is formed with less stress. While not limiting the scope of the disclosure by theoretical considerations, it is thought that least for some embodiments, the grain size and continuity of the deposited metal can affect the quality of the resulting structure. Also, for some embodiments, a sputter depositing process may mitigate the formation of rough edges which may result, e.g., if the electrode material layer 130 coats the sidewalls of the resist and then rips during liftoff.

In some embodiments, the electrode material layer 130 can have a thickness of about 100 nm, 200 nm, 300 nm, 400 nm 500 nm or 1 microns.

In some embodiments, the electrode material layer 130 can be composed of a metal that is flexible, that can covalently bond to thiols (e.g., present in some embodiments of the softening polymer layer 105), has a low electrical impedance and does not readily oxidize. Non-limiting examples include gold and silver.

In other embodiments, the electrode material layer 130 can be composed of titanium nitride, platinum, titanium, iridium, or iridium Oxide (e.g., sputtered Iridium Oxide or electro-deposited Iridium Oxide) copper, aluminum, or other metals that can be deposited by sputtering or evaporation and are compatible with the inorganic liftoff layer 110, e.g., such that subsequent photolithographic processing steps do not etch any underlying layers including the inorganic liftoff layer 110.

In some embodiments, the electrode material layer 130 can be composed of carbon nanotubes, such as poly(3,4-ethylenedioxythiophene) nanotubes, deposited via a sputtering process.

FIG. 1F shows the coverless device 100 after removing: the inorganic liftoff layer 110, the overlying organic photoresist layer 115, and the overlying electrode material layer 130, by a horizontal liftoff etch process, to leave a thin film electrode trace 140 on the target electrode trace site portion 127 of the softening polymer layer 105.

In some embodiments, the horizontal liftoff etch process includes exposing the partially constructed device 100, e.g., as shown in FIG. 1E, to an etchant solvent to slowly remove the layers 110, 115, 130 over at least several hours of time, e.g., which helps to avoid damaging the softening polymer layer 105. In some embodiments, the period of exposure to the solvent can range from about 20 hours to 36 hours at about 25° C. In some such embodiments, the device 100 is exposed to an etchant solvent including or composed of larger molecules which help make the etchant solvent compatible with, e.g., not dissolve, the softening polymer layer 105. Non-limiting examples of the etchant solvent includes an ester-based photoresist removing solvent, such as RR5 (Futurrex, Franklin, N.J.), or, a photo developing solution such as a potassium borate solution (potassium borate:water 3:17) for about 24 hours.

In some embodiments, after exposure to the etchant solvent, the device 100 can be transferred to an oven (e.g., about 100 to 150° C. for about 2 to 4 hours) to remove the etchant solvent to result in the coverless flexible device shown in FIG. 1F, having an thin film electrode trace that is pristine, that is, has never been directly exposed to photoresist or residual organic materials from the above described process steps.

As illustrated in FIG. 1E, in some embodiments, a thickness 145 of the inorganic liftoff layer 110 is deposited so as to be sufficiently large to facilitate getting the horizontal etchant solvent under the metal layer 130 and thereby facilitate an efficient rapid liftoff process. Having too thin of the liftoff layer 110 may result in the etchant solvent not getting under all of the metal layer 130 and consequently, the metal layer 130 may not be lifted off properly and metal flecks can be left on the surface of the softening polymer layer 105.

The target thickness 145 of the liftoff layer will depend on the size, and the thickness, of the metal layer 130 to be removed by the lift-off process. For example, in some embodiments, e.g., when the metal layer 130 has a horizontal dimension in the plane of the softening polymer layer 105 of at least about 400 nm, the inorganic liftoff layer 110 can have a thickness 145 in a range from about 600 nm to 1000 nm, and, in some embodiments, at least about 400 nm thick.

FIGS. 2A-2J and 2L-2M show an example flexible electrical device 200 of the disclosure at intermediate stages of an example manufacturing process of the disclosure with another embodiment of the lift-off process of the disclosure.

FIG. 2A shows the device 200 after forming a thin film electrode trace 140 on a softening polymer layer 105.

In some embodiments, the thin film electrode trace 140 on the softening polymer layer 105 can be formed by an embodiment of the process disclosed in the context of FIGS. 1A-1F. This may be preferred, e.g., for some device embodiments where the electrode material that the electrode trace 140 is composed of can form a relatively rough outer surface (e.g., a root mean squared, rms, surface roughness of about 5 nm or greater or a surface area that is at least about 100 percent greater than a surface area of perfectly planar electrode having a same two-dimensional perimeter), which as disclosed elsewhere herein can make the complete removal of photoresist material difficult.

In other embodiments, the thin film electrode trace 140 on a softening polymer layer 105 can be formed by other conventional lithography and patterning processes. For example, as disclosed in U.S. patent application Ser. No. 14/376,352, incorporated by reference herein in its entirety, the electrode material layer can be deposited (e.g., physical vapor deposition) on a sacrificial substrate (e.g., glass, silicon or a polymer) and then the softening polymer layer can be formed on the electrode material layer by a transfer-by-polymerization process. For example, a photoresist layer can be deposited on the electrode material layer on the softening polymer layer, the photoresist layer can be patterned to form opening therein to expose a negative or reverse target electrode trace site portion of the softening polymer layer, and the exposed portions of the electrode material layer can be removed, and then the photoresist layer can be removed, to uncover the thin film electrode trace 140 on the softening polymer layer 105.

This process may be used for some device embodiments where the electrode material that the electrode trace 140 is composed of can form a relatively smooth outer surface (e.g., a rms roughness of less than about 5 nm or a surface area that is within about 100 percent of a surface area of perfectly planar electrode having a same two-dimensional perimeter or a surface area of a same sized planar two-dimensional perimeter), in which case, the complete removal of photoresist material using conventional procedures is not expected to be challenging.

Figure 2B:
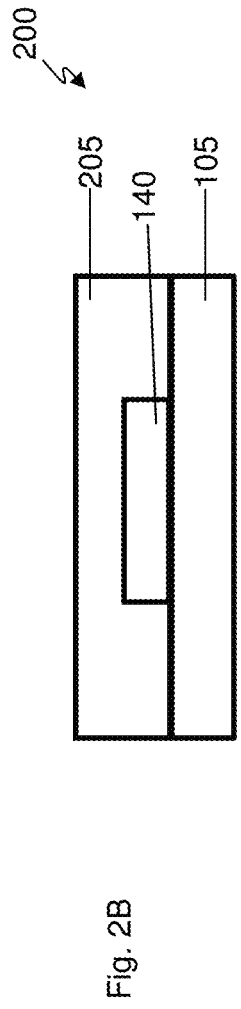

FIG. 2B shows the device 200 after forming a polymer cover layer 205 over the electrode trace on the softening polymer layer. In some embodiments, the polymer cover layer 205 can be composed of a second softening polymer and deposited by an embodiment of the processes such described in the context of FIGS. 3A-3G as disclosed elsewhere herein. In some embodiments, the polymer cover layer can be composed of a polymer such as Parylene-C or other parylene derivatives, e.g., deposited by a chemical vapor deposition process. In some embodiments the polymer cover layer can be composed of polyethylene terephthalate (PET), or other PET derivatives.

Figure 2C:
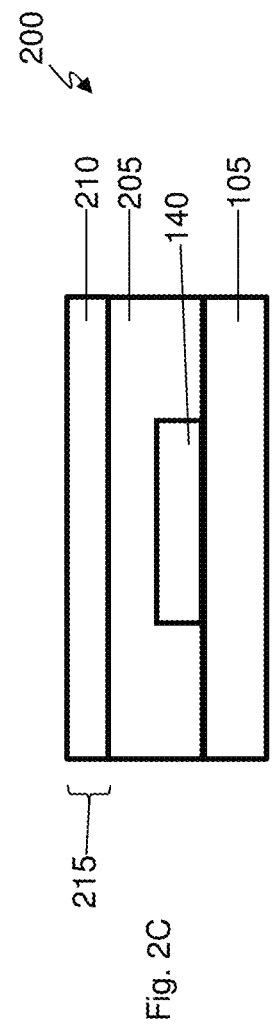

FIG. 2C shows the device 200 after forming an inorganic hardmask layer 210 on the polymer cover layer 205. The hardmask layer 210 can be composed of any of the materials and formed by any of the processes used to form the inorganic liftoff layer 110 such as disclosed elsewhere herein in the context of FIGS. 1A-1F. Unlike the lift-off layer 110, however, embodiments of the hardmask layer 210 can have a smaller thickness 215 than the thickness 145 of the liftoff layer 110. This follows because the hardmask layer 210 is not used as a solvent horizontally etched lift-off material, but rather, is used for defining a pattern and protecting the underlying polymer cover layer 205 and the softening polymer layer 105 from being damaged by a reactive ion etch patterning step as further disclosed elsewhere herein in the context of FIG. 3E. For example, in some embodiments, the inorganic hardmask layer 210 can have a thickness 215 in a range from about 10 nm to about 200 nm.

Figure 2D:
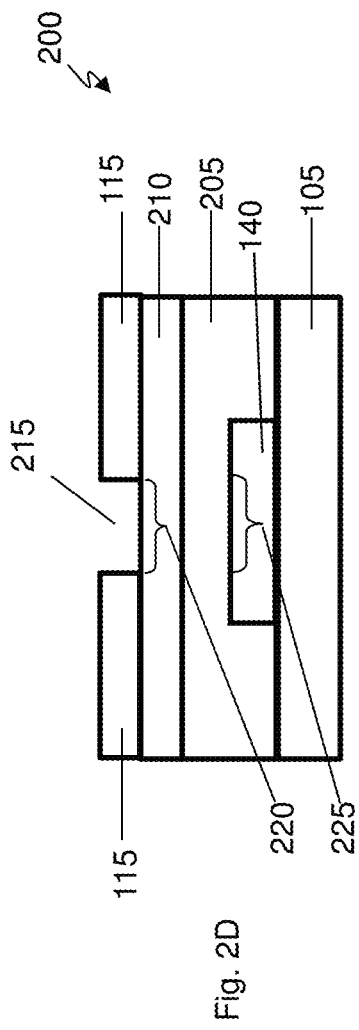

FIG. 2D shows the device 200 after forming an organic photoresist layer 115 on the inorganic hardmask layer 210 and after patterning the organic photoresist layer 115 to form an opening 215 therein to thereby expose a portion 220 of the inorganic hardmask layer 210, the opening 215 lying directly over a target electrode pad site portion 225 of the electrode trace 140. Any of the same photoresist materials and photolithography procedures as described in the context of FIG. 1C can be used to deposit and pattern the photoresist layer 115.

Figure 2E:
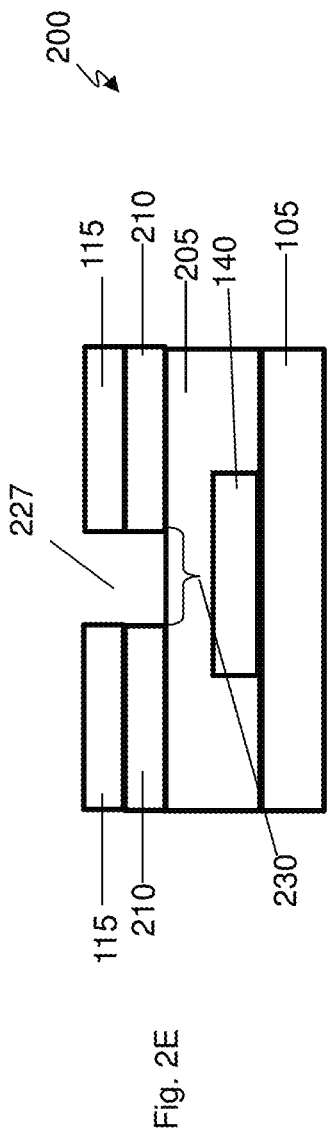

FIG. 2E shows the device 200 after removing the exposed portion 220 (FIG. 2D) of the inorganic hardmask layer 210 to form an opening 227 therein to thereby expose a portion 230 of the polymer cover layer 205.

In some embodiments, removing the exposed portion 220 of the inorganic hardmask layer 210 includes a reactive ion etch process using a $CF_4/O_2$ plasma at about 120 mtorr pressure and biasing power of about 100 W for about 10 min with a base pressure of about 40 mtorr.

Figure 2F:
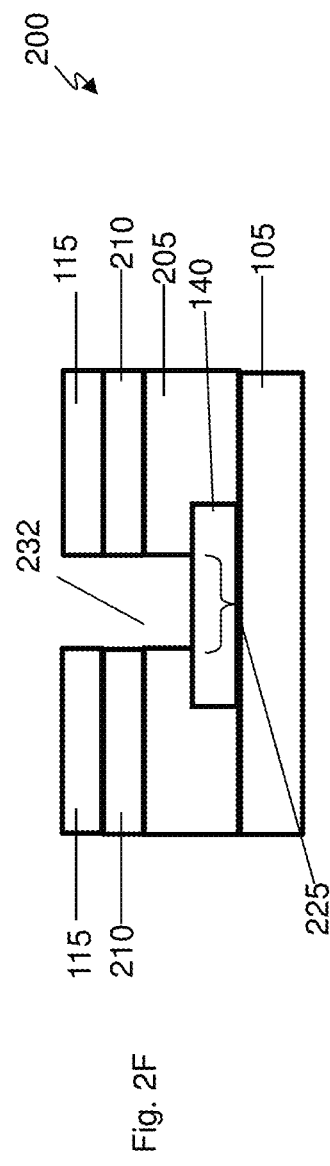

FIG. 2F shows the device 200 after removing the exposed portion of the polymer cover layer 205 to form an opening 232 therein to thereby expose the target electrode pad site portion 225 of the electrode trace 140.

In some embodiments, removing the exposed portion 230 of the polymer cover layer 205 includes a reactive ion etch process. For example, when the polymer cover layer 220 is composed of a second softening polymer then the deep reactive ion etch process described elsewhere herein in the context of FIG. 3E can be used. For example, when the polymer cover layer 220 is composed of parylene then an oxygen plasma reactive ion etch process can be used.

Figure 2G:
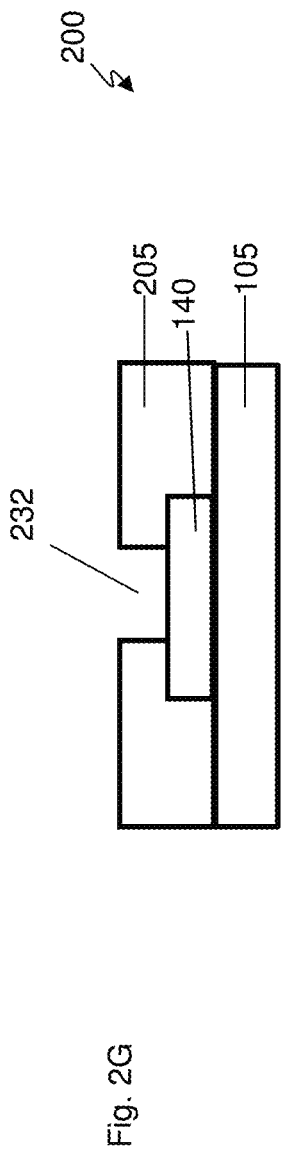

FIG. 2G shows the device 200 after removing the inorganic hardmask layer 210 and the overlaying photoresist layer 115.

In some embodiments, removing the inorganic hardmask layer 210 and the photoresist layer 115 includes soaking the device 200 in a photoresist removing solvent such as RR5 for about for about 24 to 36 hours to remove the photoresist layer 115, followed by transferring the device to an oven (e.g., about 100 to 150° C. for about 2 to 4 hrs.) to remove the solvent and then soaking the device 200 in hydrofluoric acid (e.g. concentrated 20 or 49% HF diluted in water $H_2O$:HF 5:1 or 10:1) for about 1 minute.

FIG. 2H shows the device 200 after forming an inorganic liftoff layer 235 on the polymer cover layer 205 and on the exposed target electrode interaction pad site portion 225 of the electrode trace 140.

The inorganic liftoff layer 235 can be composed of any of the same materials and be deposited by the same procedures as for the inorganic liftoff layer 110 disclosed elsewhere herein in the context of FIG. 1B. Embodiments of the inorganic liftoff layer 235 can be adjusted to have a same thickness 240 as the thickness 145 of the inorganic liftoff layer 110 such as disclosed elsewhere herein in the context of FIG. 1E.

FIG. 2I shows the device 200 after forming an organic photoresist layer 115 on the inorganic liftoff layer 235, and, after patterning the organic photoresist layer 115 to form an opening 245 therein to thereby expose a portion 250 of the inorganic liftoff layer 235, the opening 245 lying directly over the target electrode pad site portion 225 of the electrode trace 140. Any of the same photoresist materials and photolithography procedures, such as described in the context of FIG. 1C, can be used to deposit and pattern the photoresist layer 115.

FIG. 2J shows the device 200, after removing the photoresist layer 115 and the exposed portion 250 of the inorganic liftoff layer 235 to thereby form a patterned inorganic liftoff layer 235 having an opening 247 therein to thereby expose the target electrode pad site portion 225 of the electrode trace 140.

Any of the liftoff layer removal procedures, such as disclosed elsewhere herein in the context of FIG. 1D, can be used to remove the photoresist layer 115 and the exposed portion 250 of the inorganic liftoff layer 235.

FIG. 2L shows the device 200 after depositing a second electrode material layer 255 on the inorganic liftoff layer 235 and the exposed target electrode pad site portion 225 of the electrode trace 140.

Any of the electrode materials and deposition procedures such as described elsewhere herein in the context of FIG. 1E can be used to deposit the second electrode material layer 255.

In some embodiments, the second electrode material is selected to provide the layer 255 with a high surface roughness that is conducive to providing a high charge injection capacity interaction pad (e.g., about 1.5 or greater $mC/cm^2$ in some embodiments). Non-limiting examples of such electrode materials include titanium nitride, sputtered iridium oxide or carbon nanotubes.

FIG. 2M shows the device 200 after removing the inorganic liftoff layer 235 and the overlying second electrode material layer 255 by a horizontal liftoff etch to leave a thin film electrode interaction pad 260 on the target electrode pad site portion 225 of the electrode trace 140.

Any of the liftoff layer removal procedures, such as described elsewhere herein in the context of FIGS. 1E and 1F, can be used to remove the inorganic liftoff layer 235 and the overlying second electrode material layer 255.

Another embodiment is a flexible electrical device. FIG. 1E shows an example embodiment of the flexible electrical device 100, e.g., formed by the processes disclosed elsewhere herein in the context of FIGS. 1A-1E. The device 100 comprises a softening polymer layer 105 and a thin film electrode trace 140 on the softening polymer layer 105. The outer surface 145 of the electrode trace 140 has less than 100 ppm Carbon/micron$^2$ of organic material thereon.

Some embodiments of the outer surface 145 of the electrode trace 140 can have a rms surface roughness of about 100 nm or greater. Some embodiments of the outer surface 145 of the electrode trace 140 can have a surface area that is at least about 10 percent greater than a surface area of perfectly planar electrode trace having a same two-dimensional perimeter. As illustrated in FIG. 1E the device 100 can be coverless, that is, there can be no overlaying polymer cover layer on the softening polymer layer 105 or the thin film electrode trace 140.

FIG. 2M shows another example embodiment of a flexible electrical device 200, e.g., formed by the processes disclosed elsewhere herein in the context of FIGS. 2A-2J and 2L-2M. The device 200 comprises a softening polymer layer 105 and a thin film electrode trace 140 on the softening polymer layer 105. The device 200 also comprises an electrode interaction pad 260 located on a portion 225 of the electrode trace 140. The device 200 also comprises a polymer cover layer 205 covering the electrode trace 140 and the softening polymer layer 105. An opening 270 in the polymer cover layer 205 exposes an outer surface 275 of the electrode interaction pad 260. The outer surface 275 of the electrode interaction pad 260 has less than 100 ppm Carbon/micron$^2$ of organic material thereon.

Some embodiments of the outer surface 275 of the electrode interaction pad 260 can have a rms surface roughness of about 100 nm or greater. Some embodiments of the outer surface 275 of the electrode interaction pad 260 can have a surface area that is at least about 100 percent greater than a surface area of perfectly planar electrode interaction pad having a same two-dimensional perimeter. As illustrated in FIG. 2M the device 200 can be covered, that is, there can be a polymer cover layer 260 on the softening polymer layer 105 and portions of the thin film electrode trace 140.

Process for Forming Devices with a Patterned Double Softening Polymer Layer

Embodiments of present disclosure benefit from the recognition that embodiments of flexible electrical devices, when bent, are prone to electrode layer delamination when the electrode layer is located away from the mechanical neutral plane of the device.

As familiar to those skilled in the art, the mechanical neutral plane of a plate is defined in bending theory as the plane at which the normal stress is null. Its position is of importance to determine the best location for the electrode components embodiments of the flexible electrical device. When a homogeneous device is subjected to external (pure) bending only, this neutral plane is coincident with the bending axis. However when a multilayered device is considered, with stress-free strains mismatches (with or without external bending applied), the neutral plane shifts from the bending axis, and there can be one, several or even no neutral planes in the device. The mechanical neutral plane's location can often be obtained after solving the system's stress distribution. In the case of films on a substrate, solving the system's stress distribution would require the nondestructive removal of each film from the substrate. The procedure includes constructing the composite from the freely standing layers subject to the assumptions of no resultant edge forces or bending moments.

Solving such stress distribution systems for example flexible electrical device embodiments of the disclosure revealed that for certain embodiments of the flexible electrical device, the mechanical neutral plane can be shifted substantially away from the location of the electrode layer. In particular certain combinations of the softening polymer layer and the polymer cover layer, e.g., having substantially different thicknesses and/or stiffness, can result in a large shift in the mechanical neutral plane away from the surface of the softening polymer layer, e.g., where an electrode layer could be located on.

As an example, consider a flexible electrical device comprising an about 1 micron thick polymer cover layer composed of the more rigid polymer parylene and an 25 micron thick of a less rigid softening polymer layer composed of a shape memory polymer, referred to herein as SMP6, formed from the polymerization of a stoichiometric combination of the monomers TMICN and TATATO and 31 mol % TCMDA. The mechanical neutral plane of such a device is predicted to be several microns away from the surface of the softening polymer layer. We expect that an electrode layer formed on the softening polymer layer of such a device would be more prone to delamination than desired, e.g., when the device is bent.

Sometimes such large shifts in the neutral plane can be partially mitigated by, e.g., increasing the thickness of the more rigid polymer cover layer and or decreasing the thickness of the softening polymer layer. However, these mitigation measures may be insufficient for providing flexible devices that are not too rigid so as to not be able to bend enough, e.g., to form tightly curled structures, and/or, not be too fragile so as to rip, e.g., during surgical implantation, and/or, still have sufficient softening to facilitate long term functionality (e.g., months) after device implantation in living tissue.

As disclosed herein, such large shifts in the neutral plane can be substantially eliminated by manufacturing a device using a polymer cover layer composed of a second softening polymer that can have substantially a same stiffness and/or thickness as the softening polymer layer. Consequently, the electrode layer of such a double softening polymer layer-containing device can be located substantially at or near the mechanical neutral plane of the device.

The ability to use a cover layer composed of a second softening polymer, however, can be problematic. For instance, the use of conventional photolithography materials and methods to define openings in the polymer cover layer to thereby expose interaction pad portions of the electrode layer can damage or dissolve the second softening polymer or etch the metal due to bombardment of plasma on metal electrodes.

As disclosed herein a reactive ion etch process is used to etch through the second softening polymer layer. A patterned hardmask layer is used to define openings to expose portions of the second softening polymer layer to the reactive ion etch process while other portions of the second softening polymer layer are protected by the hardmask from being damaged by the reactive ion etch process.

FIGS. 3A-3G show an example flexible electrical device 300 of the disclosure at intermediate stages of an example manufacturing process of the disclosure with double softening polymer layer-containing embodiments.

FIG. 3A shows the device 300 after forming a softening polymer layer 105 with a thin film electrode trace 140 thereon. As further illustrated, some embodiments of the device 300 can optionally further include a thin film electrode interaction pad 260 on the electrode trace 140.

The softening polymer layer 105, electrode trace 140 and the optional electrode interaction pad 260 can be composed of any of the materials, have any of the thicknesses, and, be formed by any of the processes, as disclosed elsewhere herein in the context of FIGS. 1A-1E and FIGS. 2A-2J and 2L-2M.

FIG. 3B shows the device 300 during an optional reactive ion etch surface treatment of an exposed surface 305 of the softening polymer layer 105 to form a treated softening polymer layer surface 310. We discovered that for some embodiments, a subsequently formed cover layer composed of the second softening polymer may not adhere as well to the softening polymer layer 105 as desired, and consequently, the layer may be prone to delamination. In some embodiments, the formation of a treated softening polymer layer surface 310 facilitates adhesion of second softening polymer cover layer to the softening polymer layer 105.

While not limiting the disclosure by theoretical considerations, it is thought that, for at least some embodiments, the reactive ion etch surface treatment facilitates adhesion by increasing the surface area and/or increasing the number of hydroxyl groups on the treated softening polymer layer surface 310 which, e.g., can form covalent bonds to the cover layer composed of the second softening polymer.

In some embodiments, for example, the reactive ion etch surface treatment at least doubles the rms surface roughness of the surface 310. In some embodiments, the rms surface roughness of the pretreated surface 305 increases from about 1 nm to about 1 micron for the reactive ion etch surface treated surface 310.

The conditions of reactive ion etch surface treatment are selected to form the treated surface 310 without substantially etching away the softening polymer layer 105, e.g., so as to substantially reduce the thickness of the layer 105. For instance, in some embodiments, a thickness 320 of the pretreated layer 105 and a thickness 325 of the reactive ion etch surface-treated layer 310 are the same within about ±5 percent and in some embodiments within about ±1 percent.

In some embodiments, the reactive ion etch etchants 315 are formed from argon and oxygen gases feeds and the duration of the reactive ion etch can be in a range from about 600 seconds to about 1600 seconds. In some embodiments, the ratio of argon to oxygen ($Ar/O_2$) in in a range of about 1:8 to about 1:4. One skilled in the pertinent arts would understand how these conditions could be adjusted to roughen any of the embodiments of softening polymer layers disclosed herein.

For example, when the softening polymer layer 105 is composed of a 30 micron thick layer 105 of SMP6, some embodiments of the reactive ion etch surface treatment includes an $Ar/O_2$ ratio of about 1:8 applied for about 960 s.

FIG. 3C shows the device 300 after forming a cover layer 330 composed of a second softening polymer on the surface (e.g., untreated surface 305 or treated surface 310) of the softening polymer layer 105. As illustrated, the electrode trace layer 140 and the optional electrode interaction pad 260 are also covered by the second softening polymer cover layer 330.

The second softening polymer cover layer 330 can be composed of any of the softening polymer materials as disclosed elsewhere herein in the context of FIG. 1A.

The second softening polymer cover layer 330 can be formed by a spin coating process. In some embodiments for example, an appropriate amount of the second softening polymers can be dispensed on the untreated surface 305 or treated surface 310 of the softening polymer layer 105 and then spun at about 2000 rpm for about two minutes to achieve an about 10 micron thickness of the second softening polymer cover layer 330 on the softening polymer layer 105. One skilled in the pertinent art would understand how different thicknesses of second softening polymer cover layer 330 could be achieved though different combinations of adjusting the amounts of second softening polymers dispensed and/or adjusting the speed or duration of spinning.

In some embodiments, to facilitate providing a mechanical neutral plane 332 substantially at the surface (e.g., at surface 305 or 310) of the softening polymer layer 105, the second softening polymer cover layer 330 can be configured to have a substantially same stiffness as a stiffness of the softening polymer layer 105. For instance, in some embodiments the second softening polymer cover layer 330 selected to have a Young's modulus that is substantially equal to (e.g., at least within about ±10 percent, or, about ±1 percent, in some embodiments) a Young's Modulus of the softening polymer layer 105. In some embodiments the Young's modulus is substantially the same over a range of target operating temperatures of the device 300 (e.g., about 10° to 60° or about 20° to 45° C. for some embodiments).

In some embodiments, to facilitate having a substantially same stiffness as the stiffness of the softening polymer layer 105, the second softening polymer cover layer 330 can be composed of the same softening polymer that the softening polymer layer 105 is composed of.

In some embodiments, to facilitate having a substantially same stiffness as the stiffness of the softening polymer layer 105, the second softening polymer cover layer 330 can have a substantially same thickness 335 (e.g., within about ±10 percent, or about ±1 percent) as the softening polymer layer's 105 thickness (e.g., thickness 320 or 325). For example, in some embodiments, when the softening polymer layer's 105 thickness e.g., thickness 320 or 325) equals 20 microns or 30 microns then the second softening polymer cover layer's thickness 335 can equal about 20±2 microns and 30±3 microns, respectively.

In some embodiments, to mitigate electrode layer delamination, the stiffness of the second softening polymer cover layer 330 can be adjusted so that the mechanical neutral plane 332 is located above the surface (e.g., above surface 305 or 310) of the softening polymer layer 105. For example, the stiffness of the second softening polymer cover layer 330 can be adjusted such that the mechanical neutral plane 332 is located above the surface (e.g., above surface 305 or 310) of the softening polymer layer 105 and at a surface 337 of the thin film electrode trace 140 or at a surface 339 of the optional electrode interaction pad 260.

Adjusting the stiffness of the second softening polymer cover layer 330 can including adjusting one or both of the composition or thickness 335 of the layer 330.

For example, consider a device 300 embodiment where the softening polymer layer 105 is composed of SMP6 has a Young's modulus at 37° C. equal to about 1.8 GPA when dry, the layer 105 has a thickness (e.g., thickness 320 or 325) of 25 microns and the thin film electrode trace 140 composed of gold having a thickness of 0.5 microns and the electrode interaction pad 260 composed of sputtered iridium oxide has a thickness of 0.2 microns.

To provide a mechanical neutral plane 332 at the surface 337 of the thin film electrode trace 140, the second softening polymer cover layer 330 can be adjusted so as to have a thickness of about 25.5 microns.

To provide a mechanical neutral plane 332 at the surface 339 of the optional electrode interaction pad 260, the second softening polymer cover layer 330 can be adjusted so as to have a thickness of about 26.2 microns.

Alternatively, the neutral plane 332 can be adjusted by changing the monomer composition so as to change the Youngs modulus of the resulting underlying softening polymer 105. For example, for the above example, changing the composition from TATATO/TMICN/TCMDA (0.345/0.345/0.31) to (0.385/0.385/0.23), can shift the neutral plane 332 to the surface 337 and by further reducing the amount of TCMDA to 0%,(0.5/0.5/0), the neutral plane 332 can be shifted to surface 339 under biological implantation conditions (e.g., about 37° C. in a wet aqueous environment). For example, as disclosed in Ware et al. (2014), the polymer formed from TATATO/TMICN/TCMDA (0.345/0.345/0.31), TATATO/TMICN/TCMDA (0.385/0.385/0.23) or TATATO/TMICN/TCMDA (0.5/0.5/0) can have a Storage Modulus (G', related to Young's Modulus by Poisson's ratio as understood by those skilled in the pertinent art) of about 800 MPa in a dry state at 37° C., and, a G' in a range from about 5 MPa (0.5/0.5/0) to about 23 MPa (0.345/0.345/0.31) at 37° C.

FIG. 3D shows the device 300 after forming an inorganic hardmask layer 210 on the second softening polymer cover layer 330. The hardmask layer 210 can be composed of any of the materials and can be formed by any of the processes to form the inorganic liftoff layer 110 such as disclosed elsewhere herein in the context of FIGS. 1A-1F. The hardmask layer 210 can have any of the thicknesses as disclosed elsewhere herein in the context of FIG. 2C.

FIG. 3D also shows the device 300, after forming an organic photoresist layer 115 on the inorganic hardmask layer 210 and after patterning the organic photoresist layer 115 to form an opening 215 therein, to thereby expose a portion 220 of the inorganic hardmask layer 210, the opening 215 laying directly over the electrode trace 140 or over the optional electrode interaction pad 260 or over a target electrode pad site portion 225 of the electrode trace 140 (see e.g., FIG. 2D). Any of the same photoresist materials and photolithography procedures, such as described elsewhere herein in the context of FIG. 1C, can be used to deposit and pattern the photoresist layer 115.

FIG. 3E shows the device 300, after patterning the inorganic hardmask layer 210 by removing the exposed portion 220 (FIG. 2D) of the inorganic hardmask layer 210 to form an opening 227 in the inorganic hardmask layer 210 to thereby expose a portion 230 of the second softening polymer cover layer 330.

Removing the exposed portion 220 of the inorganic hardmask layer 210 can include any of the procedures as disclosed elsewhere herein in the context of FIG. 2E.

FIG. 2F shows the device 200, after removing the exposed portion 230 the second softening polymer cover layer 330 to form an opening 232 therein to expose a surface 275 of the electrode interaction pad 260 (or an analogous surface of the electrode trace 140, or of a target electrode pad site portion 225 of the electrode trace 140).

In some embodiments, removing the exposed portion 230 of the second softening polymer cover layer 330 includes a deep reactive ion etch process.

For example, when the second softening polymer cover layer 330 is composed of an about 25 micron thick layer of SMP6, one embodiment of the deep reactive ion etch process can include plasma formed from a feed gas of oxygen at about 200 W biasing power and a pressure of about 200 mTorr for about 2 hours under a base pressure of about 40 mtorr. For example, when the second softening polymer cover layer 330 is composed of an about 5 micron thick layer of SMP6, one embodiment of the deep reactive ion etch process can include plasma formed from a feed gas of oxygen at 200 W biasing power and a pressure of about 200 mTorr for about 0.5 hours under a base pressure of about 40 mtorr.

Based on these examples one skilled in the pertinent art would understand how to adjust the conditions and parameter ranges of the deep reactive ion etch process to form openings in any of the disclosed embodiments of softening polymer layers.

As further illustrated in FIGS. 3D-3F, in some embodiments, the patterning, removing and deep etching procedures can be used to form one or more through-holes in the device 300.

For example, patterning the organic photoresist layer 115 can further include forming a second opening 340 therein to thereby expose a second portion 342 of the inorganic hardmask layer 210 that does not directly overlay the electrode trace 140 or the optional electrode interaction pad 260 or the target electrode pad site portion 225. For instance, the second opening 340 may be located remotely from the electrode trace 140, e.g., near a perimeter 345 of the softening polymer layers 105, 330

For example, removing a portion of the inorganic hardmask layer 210 can further include removing the second portion 342 of the inorganic hardmask layer 210 to form an opening 348 therein to thereby expose a second portion 350 of the second softening polymer cover layer 330.

For example in some embodiments, the deep etch procedure can include removing the exposed second portion 350 of the second softening polymer cover layer 330 to form an opening 352 therein to thereby expose an underlying portion 354 of the softening polymer layer 105 which is also removed by the deep etch to form an opening therein 356. The openings 352, 356 together form a through-hole 360 in the double softening polymer layers 105, 330 of the device 300.

In some embodiments, the through-holes 360 are used to facilitate anchoring or fixing the device 300 to a structure present in the target environment of the device 300. For example, in some embodiments, a suture material can be passed through one or more such through-holes 360 of the device 300 and then the suture material can be tied to a tissue structure that the device is implanted inside of, or, located on.

FIG. 3G shows the device 200, after removing the inorganic hardmask layer 210 and the overlaying photoresist layer 115.

The hardmask layer 210 and the overlaying photoresist layer 115 can be removed by any of the procedures as disclosed elsewhere herein in the context of FIG. 2G.

FIG. 3G illustrates another embodiment of a flexible electrical device 300 of the disclosure, e.g., formed by the processes disclosed elsewhere herein in the context of FIGS. 3A-3F. The device 300 comprises a softening polymer layer 105 and one or more electrode layers (e.g., electrode trace 140 and optional electrode interaction pad 260) on the softening polymer layer 105. The device 300 further comprises a cover layer 330 composed of a second softening polymer. An opening 270 in the polymer cover layer 330 exposes an outer surface 275 of the electrode layer. A mechanical neutral plane 332 of the device 300 is located substantially at or above the surface 365 of the softening polymer layer 105.

Solder Reflow Process for Forming Electrical Contacts on Softening Polymers

Forming electrical contacts on flexible electrical devices that comprise softening polymer layers poses a number of problems. Solder reflow processes can oxidize and destroy the softening polymer layer or can delaminate from thin film electrode traces on the softening polymer layer due to poor adhesion. Elevated temperatures during a solder reflow can cause the softening polymer layer to soften and thereby not provide a solid base to electrical contact connection. Atoms of conventional solders can migrate into the electrode trace layer during solder reflow and thereby undesirably reduce the electrical conductivity of the electrode trace layer. Conventional approaches to prevent such atomic migration and poor adhesion include forming a nickel adhesion and barrier layer between the solder contact and the contact pad site on the electrode trace. However, heat can stress nickel layers formed on electrode trace layers thereby causing the nickel layer to curl up and delaminate from the electrode trace layer. Additionally, the use of lead-based solder and nickel adhesion and barrier layers in flexible electrical devices that can be implanted in living tissue can be undesirable due to the bio-toxicity of such metals.

To address these problems, we have developed a solder reflow process for forming solder contacts for electrical connector electrodes coupled to thin film electrode traces on a softening polymer layer. Embodiments of the solder contact can be formed from a low melting point lead-free solder paste and a nickel adhesion and barrier layer is not required. As further disclosed below, the solder reflow cycle has optimized timing for preheating, soaking, reflow and cooling to facilitate attachment coupling an electrical connector electrode to an electrode trace on the softening polymer layer while minimizing damage to the softening polymer layer.

FIGS. 4A-4F show an example flexible electrical device 400 of the disclosure at intermediate stages of an example manufacturing process of the disclosure using the solder reflow process disclosed herein.

FIG. 4A shows the device 400 after forming one or more thin film electrode traces 140 on a softening polymer layer 105, and, forming a polymer cover layer 205 on the softening polymer layer 105 and electrode traces 140. Patterned openings 232 in the polymer cover layer 205 expose contact pad site portions 410 of the electrode traces 140.

The softening polymer layer 105, polymer cover layer 205 and thin film trace electrodes can be composed of any of the materials, have any of the physical properties (e.g., thickness, roughness, carbon-free surface) and be formed by any of the procedures such as disclosed in the context of FIGS. 1A-1F, 2A-2J, 2L-2M and 3A-3G.

In some embodiments, the softening polymer layer 105 and/or the polymer cover layer 205 can be formed from the polymerization of monomers that includes at least one type of thiol-functionalized monomer. It is thought that such a polymer layer, when formed on certain electrode materials such as gold, e.g., by the transfer-by-polymerization process, can have improved adhesion to the subsequently patterned thin film electrode traces due to covalent bonding between the thiols and the electrode material. This in turn, is thought to mitigate against delamination of the electrode trace layer 140 from the softening polymer layer 105 and/or the polymer cover layer 205 during the solder reflow process.

FIG. 4B shows the device 400 after placing a stencil mask 415 on or over the polymer cover layer 205 such that each aperture 420 in the stencil mask 415 align with one of the openings 232 in the polymer cover layer 205 that expose a contact pad site portion 410. The stencil mask 415 can be made of any conventional stencil material such as stainless steel or other metal materials familiar to those skilled in the pertinent art.

FIG. 4B also show the device 400 after depositing a solder paste 425, e.g., a lead free solder paste, on the stencil mask 415 and locating a stencil printer 430 adjacent to the solder paste 425. The term lead free solder as used herein refers to solder having less than about 0.1% lead.

In some embodiments, the lead free solder paste 425 can be composed of an indium silver solder. The use of indium-silver-solder has an advantage of eliminating the need for a nickel adhesion and barrier layer because, under the printing and reflow conditions used herein, the indium and silver atoms do not readily migrate into the thin film trace layer 140

In some embodiments, the indium silver solder has a mole ratio of indium:silver equal to about 97:3. In some embodiments, the indium silver solder has a melting point of about 143° C. In other embodiments, the lead-free solder paste 425 can include alloys of indium, silver, gold, tin and bismuth.

Those skilled in the pertinent arts would be familiar with how, as part of a stencil printing process, the stencil printer 430 could be configured to move the solder paste 425 over the stencil mask 415 (e.g., along direction 435) so that the solder paste is transferred through the apertures 420 and into the openings 232, to thereby transfer the pattern of the stencil mask 415 onto the polymer cover layer 205 of the device 400.

Those skilled in the pertinent arts would be familiar with stencil printing parameters, e.g., the stencil printer pressure and printing speed and temperature to accomplish stencil printing.

FIG. 4C shows the device 400 after completing the stencil printing process to provide a layer 440 of the solder paste that fills the apertures 420 and openings 232 and contacting the exposed contact pad site portions 410 of the electrode traces 140.

FIG. 4D shows the device 400 after removing the stencil mask 415 to form discrete solder contacts 445 located on the exposed contact pad site portions 410 of the electrode traces 140. As illustrated, for some embodiments, to facilitate subsequent contact to an electrical connector electrode, a top surface 450 of the solder contact 445 is located above an outer surface 455 of the polymer cover layer 205.

FIG. 4E shows the device 400 after aligning electrical connector electrodes 460 with each of the solder contacts 445 such that each one of the connector electrodes 460 lays on the top surface 450 of one of the solder contacts 445.

In some embodiments the electrical connector electrodes 460 are composed of gold film having a thickness of about 500 to 700 nm. In some embodiments, the electrical connector electrodes 460 are aligned manually with the solder contacts 445 with the aid of a microscope and micromanipulators. In some embodiments, alignment is aided using thin adhesive film such as PDMS or tape adhered to connector electrodes 460.

FIG. 4F shows the device 400 after a solder reflow process to couple the electrical connector electrodes 460 to the contact pad site portions 410 of the electrode traces 140 via the reflowed solder 465.

In some embodiments the solder reflow process includes a reflow cycle conducted in a solder reflow oven. In some embodiments the solder reflow cycle includes a pre-heat phase, to adjust the device 400 including the solder contacts 445 and the electrical connector electrodes 460 (and some embodiments a recording or stimulating control device coupled to the electrical connector electrodes 460) to a desired temperature for subsequent steps and/or volatilize and outgas any solvent present in the solder. Some embodiments of the pre-heat phase includes increasing the temperature by about 1° C./s until the device 400 including the solder contacts 445 and the electrical connector electrodes 460 reach a temperature of about 90° C.

In some embodiments, the solder reflow cycle includes a soaking phase during which time any solvent in the solder past continues to outgas and flux present in the solder is activated. Some embodiments of the soaking phase includes increasing the temperature by about 0.17° C./s until the solder contacts 445 and the electrical connector electrodes 460 reach a temperature of about 150° C. at which point solder paste volatiles are removed and fluxes are activated.

In some embodiments, the solder reflow cycle includes a reflow phase where the maximum allowable temperature of the entire solder reflow cycle is reached. During this cycle the activated flux reduces surface tension at the juncture of the metals to accomplish metallurgical bonding, facilitating individual solder powder spheres to enter a liquid state and combine. Some embodiments of the reflow phase includes increasing the temperature by about 0.42° C./s until the device 400 including the solder contacts 445 and the electrical connector electrodes 460 reach a temperature of about 190° C.

In some embodiments, the solder reflow cycle includes a cooling phase to gradually cool the device 400 and solidify the solder joints formed between the solder contacts 445 and the electrical connector electrodes 460 and in some embodiments, cool any recording or stimulating control device coupled to the electrical connector electrodes 460. Gradual cooling help prevent excess intermetallic formation or thermal shock to the components. Some embodiments of the cooling phase includes decreasing the temperature at a rate of 1.83° C./s until rate of decrease reaches 40° C./s and until the device 400 including the joined solder contacts 445 and the electrical connector electrodes 460 is at room temperature.

Based on the above examples, one skilled in the pertinent art would understand how to adjust these various phases of the solder reflow cycle, e.g., to accommodate various compositions of the solder contacts 445 or electrical connector electrodes 460.

FIG. 4F illustrates another embodiment of a flexible electronic device 400, e.g., formed by any embodiments of the processes disclosed in the context of FIGS. 4A-4F.

The device 400 comprises a softening polymer layer 105 and a thin film electrode trace 140 on the softening polymer layer 105. The device 300 further comprises a cover polymer layer 205. An opening 270 in the polymer cover layer 205 is filled with a reflowed lead-free solder 465. One end 470 of the reflowed lead-free solder 465 inside the opening 232 contacts a contact pad site portion 410 of the electrode trace 140. Another end 475 of the reflowed lead-free solder 465 contacts the electrical connector electrode 460 of the device 400.

In some embodiments, the electrical connector electrode 460 can be electrically connected to recording or stimulating control devices such as an integrated circuit (e.g. an application specific integrated circuit), a nano-Omnetics connector, a wireless chip or a metal wire connected these or other devices.

Those skilled in the art to which this application relates will appreciate that other and further additions, deletions, substitutions and modifications may be made to the described embodiments.

The invention claimed is:

1. An electrical device, comprising:
a softening polymer layer;
an electrode layer on a surface of the softening polymer layer; and
a cover layer composed of a second softening polymer on the surface of the softening polymer layer, wherein:
a mechanical neutral plane of the device is located at or above the surface of the softening polymer layer, and
an opening in the second softening polymer cover layer exposes a portion of a surface of the electrode layer, wherein the softening polymer layer and the cover layer of the second softening polymer are composed of a softening polymer having a Young's modulus that decreases by more than 1 order of magnitude within a 30° C. temperature increase.

2. The electrical device of claim 1, wherein the cover layer has a Young's modulus that is within ±10 percent of a Young's modulus of the softening polymer layer.

3. The electrical device of claim 1, wherein the cover layer has a thickness that is within ±10 percent of a thickness of the softening polymer layer.

4. The electrical device of claim 1, wherein the within 30° C. temperature increase is from a lower temperature of 20° C. to a higher temperature of 50° C.

5. The electrical device of claim 1, wherein the within 30° C. temperature increase is from a lower temperature of 20° C. to a higher temperature of 37° C.

\* \* \* \* \*